United States Patent [19]
Banu

[11] Patent Number: 4,742,308
[45] Date of Patent: May 3, 1988

[54] BALANCED OUTPUT ANALOG DIFFERENTIAL AMPLIFIER CIRCUIT

[75] Inventor: Mihai Banu, Murray Hill, N.J.

[73] Assignee: American Telephone and Telegraph Company, AT&T Bell Laboratories, Murray Hill, N.J.

[21] Appl. No.: 37,301

[22] Filed: Apr. 10, 1987

[51] Int. Cl.$^4$ .............................................. H03F 3/45
[52] U.S. Cl. ..................................... 330/258; 330/252
[58] Field of Search ............... 330/258, 252, 260, 261, 330/259

[56] References Cited

U.S. PATENT DOCUMENTS 4,697,152  9/1987  Westwick ........................... 330/258

*Primary Examiner*—Gene Wan
*Attorney, Agent, or Firm*—David I. Caplan

[57] ABSTRACT

A differential operational amplifier circuit, having an input stage and an output stage, is balanced—i.e., is designed to have zero common mode component in its output—by means of a common mode feedback loop arrangement. This arrangement includes a common mode detector, connected for detecting the common mode signal component in a pair of outputs of the output stage of the circuit, and a pair of current steering devices, connected for drawing equal currents from each of the outputs of the input stage. During operation, the common mode detector feeds back a suitable control signal to each of the current steering devices, whereby the common mode component in the outputs is substantially completely suppressed.

7 Claims, 1 Drawing Sheet

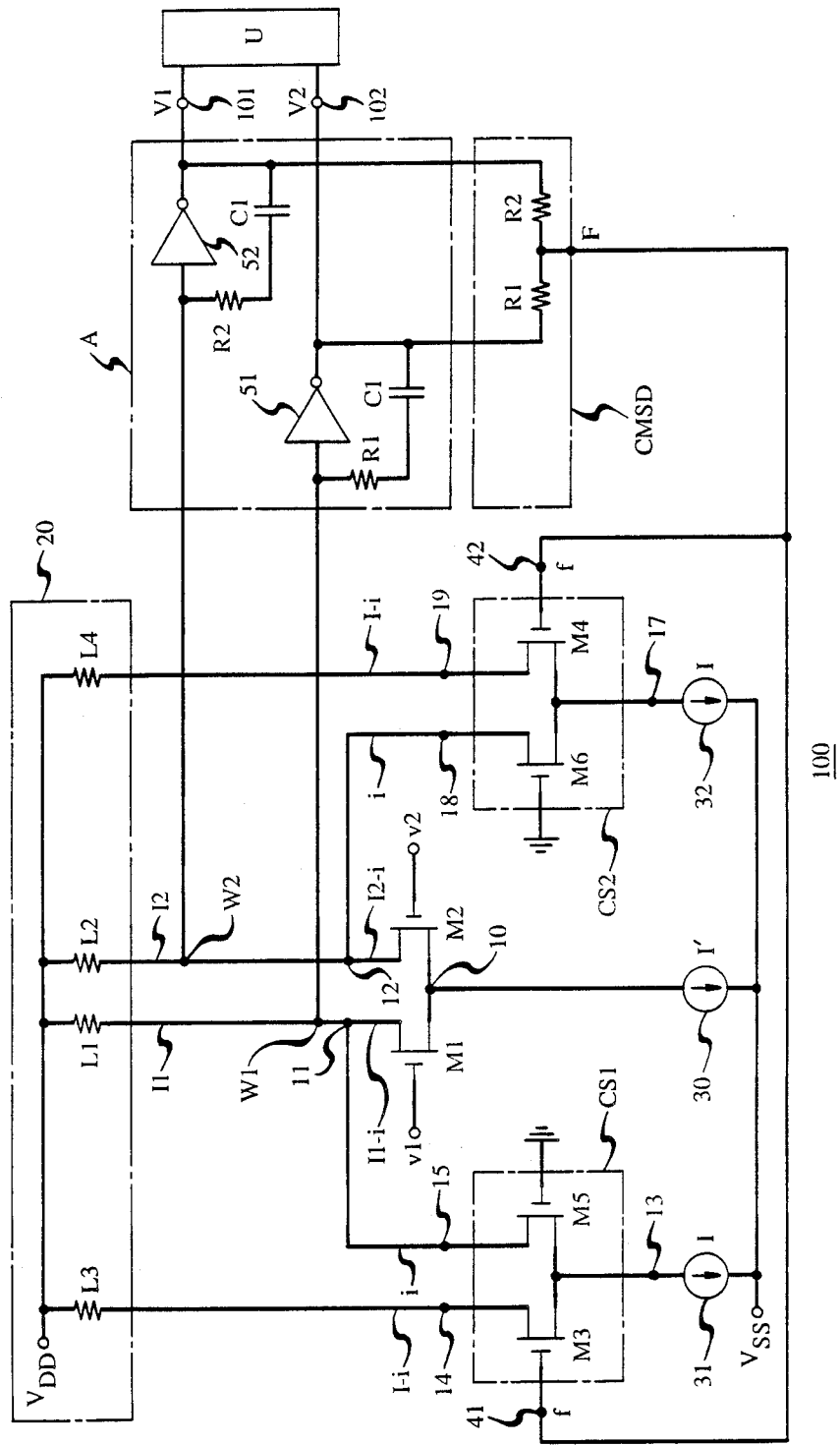

BALANCED OUTPUT ANALOG DIFFERENTIAL AMPLIFIER CIRCUIT

FIELD OF INVENTION

This invention relates to analog integrated semiconductor circuits and more particularly to analog amplifier circuits.

BACKGROUND OF THE INVENTION

A balanced output analog differential (or "difference") amplifier circuit is a circuit to which a pair of analog input signals is applied and from which emerges an amplified pair of balanced analog output signals. That is, in response to a pair of input analog voltage signals v1 and v2, such an amplifier produces a balanced pair of amplified output analog signals V1 and V2, the output signals V1 and V2 being amplified voltages that are substantially equal in magnitude and opposite in polarity: $(V1-V2)=G(v1-v2)$, where G is the gain of the amplifier, and, at the same time, $V1+V2=0$, or $V1=-V2$, regardless of the values of the voltages of the input signals v1 and v2. Notice that this situation of balanced outputs is a case of rejectio of common mode component by an amplifier, i.e., where in response to any two inputs v1 and v2 that are equal (v1=v2) the outputs V1 and V2 are both equal to zero: $V1=V2=0$.

Notice also that a balanced output amplifier $(V1=-V2)$ ensures that in response to any increments Dv1 and Dv2 in the inputs v1 and v2, respectively, the corresponding increments DV1 and DV2 in the outputs will substantially satisfy the relation $DV1+DV2=0$ or $DV1=-DV2$. Thus, any nonlinearity in the amplifier's response which would otherwise make the absolute magnitude of DV1 differ from that of DV2 is compensated, so that the absolute magnitudes of DV1 and DV2 are always substantially equal in the case of the balanced output amplifier. In other words, in a balanced output amplifier, the common mode output component is suppressed whether it is caused by common mode in the input or by internal sources of common mode, such as nonlinearity of the amplifier's response.

A balanced output differential amplifier, because of its two balanced outputs, can be used to advantage in conjunction with symmetric circuit topologies. For example, in the field of analog integrated circuits, symmetric networks have been used to improve both the dynamic range and the power supply noise rejection of integrated circuit filters, both of the continuous time and of the switched capacitor variety, and the balanced output differential amplifier can thus be used to advantage in such integrated circuit filters for the purpose of amplifying signals therein.

In U.S. Pat. No. 3,786,362, a balanced output analog differential amplifier circuit is described in which a common mode detector of the common mode component in the output supplies a feedback control signal to a pair of variable loads, the loads being connected in an input stage of the amplier circuit. The feedback signal varies the respective impedances of the loads, and hence varies their respective voltage drops, so that the common mode component tends to be suppressed. This amplifier circuit, however, suffers from the problem that the feedback becomes inoperative in suppressing the common mode in the output when the input signals are such that they turn off both of the transistors (in the amplifier's input stage) to which the input signals are applied.

SUMMARY OF THE INVENTION

The foregoing problem is mitigated in a balanced output analog differential amplifier circuit by utilizing negative feedback to control current steering of the output currents of a pair of transistors in an input stage of the amplifier. The feedback is supplied by a detector of common mode voltage component in an output stage of the circuit, whereby the common mode component of the output stage is reduced even when both transistors in the input stage are turned off by the input signals. More specifically the circuit comprises:

(a) an input difference amplifier section having first and second output nodes;

(b) an output amplifier section having first and second input nodes respectively connected to the first and second output nodes of the input section, and having first and second output terminals;

(c) a common mode signal detector, responsive to the voltages developed at the first and second output terminals of the output section, for generating a feedback control signal which is representative of the common mode component of these voltages; and (d) first and matched second current steering devices, each having a separate control terminal connected to receive the feedback control signal, connected to the first and second output nodes of the input difference amplifier section, whereby the first and second current steering devices draw equal first and second currents, respectively, from the first and second output nodes, respectively, in accordance with the feedback control signal, whereby the common mode component of the voltages at the first and second output terminals of the output section is reduced.

Advantageously the output section is a double-input double-output section having a nonzero common-mode, as well as nonzero difference mode, transfer characteristic-that is, in response to a change in common-mode or difference-mode input, a significant change in common-mode of difference-mode output is generated, respectively. As used herein, the term "double-input double-output amplifier section" also includes the case of two parallel single-input single-output amplifier sections, and the term "section" includes one or more stages. Moreover, advantageously the respective signal paths from the first and second input nodes of the output amplifier section to the first and second output terminals thereof are matched (substantially identical) to avoid spurious phase shifts in the output signal.

BRIEF DESCRIPTION OF THE DRAWING

This invention, together with its features, characteristics, and advantages may be better understood from the following detailed description when read in conjunction with the drawings in which the FIGURE is a schematic circuit diagram of a balanced output analog differential amplifier circuit in accordance with a specific embodiment of the invention.

DETAILED DESCRIPTION

The FIGURE shows an amplifier circuit 100 for balanced amplification of input signals v1 and v2 to produce balanced output signals V1 and V2 at output terminals 101 and 102, respectively, for use by a utilization means U such as an analog filter circuit or portion thereof. The amplifier circuit 100 together with the utilization means U typically are integrated in a single semiconductor chip to form a monolithic integrated circuit. A differential pair of input MOS transistors M1 and M2, both typically n-channel MOS (N-MOS) enhancement transistors, have their gate electrode terminals separately connected to receive the input signals v1 and v2, respectively. The source terminals S of these transistors are connected together to a common node 10 to which a constant current source 30 of current I' is connected. The drain terminals D of these transistors M1 and M2 are separately connected to nodes (points) 11 and 12, respectively, and these nodes are separately connected to separate loads L1 and L2 in a load network 20, whereby in response to input signals v1 and v2 different currents I1 and I2 can flow from the load network 20 toward the nodes 11 and 12, respectively, the difference (I1−I2) between these currents depending upon the difference (v1−v2) between the voltages of input signals v1 and v2. The transistors M1 and M2, together with the loads L1 and L2, form an input difference amplifier section having but one stage.

The nodes 11 and 12 are separately connected to the input terminals of a double-input double-output amplifier output section A having but one stage, typically a parallel pair of matched (substantially identical) inverting operational amplifier sections 51 and 52, each typically having one stage typically formed by an inverter. By virtue of the amplifier sections 51 and 52 being matched, the signal paths through them are equal. This amplifier section A generates the outputs V1 and V2 at the output terminals 101 and 102, respectively, of the amplifier circuit 100 for use by the utilization means U. A common mode signal detector CMSD is connected to the output terminals 101 and 102 of the circuit 100, in order to develop a feedback voltage control signal f. Typically, the common mode signal detector CMSD is formed by a pair of matched (substantially identical) resistors R1 and R2 connected together in series between the output terminals 101 and 102, and the feedback signal f is generated at an output terminal F of the detector CMSD located midway between the matched resistors R1 and R2.

Each of a pair of matched (substantially identical) current steering devices CS1 and CS2 has a separate control terminal 41 and 42, respectively, connected to the output terminal F of the common mode signal detector CMSD, whereby both of these current steering devices are controlled by the same feedback signal f. The current steering device CS1 has three current-carrying terminals 13, 14, and 15 which are separately connected to a current source 31 of current I, to a load L3 in the load network 20, and to the node 11, respectively; whereas the current steering device CS2 has three current carrying terminals 17, 18, 19 which are separately connected to a current source 32 also of current I, to a load L4 in the load network 20, and to the node 12, respectively. The current sources 30, 31, and 32 are all connected to a power source VSS. The currents I and I' are conveniently, but not necessarily, made equal.

Advantageously, the loads L1 and L2 constitute a matched pair; i.e., the impedances resistances of the loads L1 and L2 are equal to each other. Likewise the loads L3 and L4 also constitute a matched pair. Since the loads L3 and L4 carry the same current, they can be consolidated into a single load having one of its terminals connected to VDD and the other connected both to node 14 and to node 19.

The current steering device CS1 is conveniently formed by a matched pair (substantial identical) n-channel MOS (N-MOS) enhancement transistors M3 and M5. The source terminals S of M3 and M5 are connected together to the terminal 13 of CS1, and the drain terminals D of M3 of M5 are separately connected to the terminals 14 and 15, respectively of CS1. The gate terminal of M5 is connected to ground potential, and the gate terminal of M3 is connected to the control terminal 41 of the current steering device CS1. The other current steering device CS2 is similarly formed by a matched pair of MOS enhancement transistors M4 and M6 which are connected in a manner similar that of M3 and M5 in CS1, as indicated in the FIGURE. Note that, in case the amplifier A is replaced by a non-inverting amplifier, then the connections to the gate terminals of M3 and M5 should be interchanged, as should the connections to the gate terminals of M4 and M6, so that the gate terminals of M3 and M4 are connected to ground and the gate terminals of M5 and M6 are connected to the output terminal F of the detector CMSD.

It is important that the current steering device CS1 (and likewise the uniqueness device CS2) has the uniqueness property that, for a given I supplied by the source 31, the current i flowing into its terminal 15 is uniquely determined by the feedback voltage f. Such a uniqueness property can be obtained, for example, by using the kind of current sources CS1 and CS2 shown in the FIGURE, in conjunction with a sufficient power supply voltage VDD and loads L3 and L4 in the load network 20 which maintain the voltages at nodes 14 and 19 at a sufficiently high value in relation to VSS so that the transistors in the current steering devices are in their saturation conditions—i.e., in the conditions where the currents in the transistors depend only upon gate-to-source voltages and not upon drain voltages. Under these conditions, for a given I and given f, for example, the voltage at terminal 13 of CS1 automatically attains a uniquely determined value such that the current flowing into the terminal 14 of CS1 plus the current i flowing from the node 11 into the terminal 15 of CS1 add up to the current I supplied by the source 31. At the same time, it is important that under these same conditions the current i itself is uniquely determined by I and f, so that the current i that CS1 draws from node 11 is thus uniquely determined by I and f. Likewise the current i that the other steering device CS2 draws from node 12 similarly should be uniquely determined.

Since CS1 and CS2 are matched, the voltages developed at their respective terminals 13 and 17 are equal, and hence these terminals optionally can be connected together to a single current source of 2I, instead of being separately to the two separate current sources 31 and 32. In such a case, the MOS transistors M3 and M4 can be consolidated into a single transistor of double size (double the channel width).

Each of the loads L1, L2, L3, and L4 is typically formed by a P-MOS enhancement transistor whose gate terminal connected to its drain terminal and whose source terminal is connected to the power supply VDD, typically +5 volts. Alternatively, the gate terminals of the transistors forming L1 and L2 can be separately connected to the nodes 14 and 19, respectively. Each of the current sources 30, 31, 32 is typically formed by an N-MOS enhancement transistor whose source terminal is connected to the power source VSS, typically −5 volts, and whose gate terminal is connected to a suitable intermediate voltage bias supply, typically −3.5 volts.

Each of the inverting operational amplifiers 51 and 52 typically is an inverter formed by an P-MOS enhancement input transistor connected in series with a current source, again typically formed by an N-MOS enhancement transistor.

Compensation for phase delays in the amplifier A, to avoid instabilities such as those caused by feedback, can be afforded in each of the inverters by a resistor-capacitor series combination such as r1, c1 and r2, c2, respectively, connected between the input and output nodes of the inverter as shown in the FIGURE. Note that these resistor-capacitor combinations compensate simultaneously for phase shifts both in the common mode and in the difference mode signals.

During operation, if the common mode component (V1+V2)/2 of the output is, say, positive, then the feedback signal f will likwise be positive. In response thereto, the current steering devices CS1 and CS2 will draw more current i from the nodes 11 and 12, respectively, whereby the currents I1 and I2 will increase. In turn, the voltage drop across the loads L1 and L2 will increase, whereby the voltages w1 and w2 at nodes 11 and 12, respectively, will both decrease, and hence the absolute magnitude of (V1+V2)/2 will decrease. Thus, the common mode component (V1+V2)/2 in the output will be reduced by virtue of the feedback f, as is desired for a balanced output amplifier circuit.

The feedback signal f thus acts as a negative feedback control signal to reduce the common mode component in the output. Advantageously, the overall open loop common-mode gain G of the amplifier circuit 100 is made to be large compared with unity, whereby in accordance with the general principles of negative feedback this feedback will reduce the common mode (V1+V2)/2 by the factor G. Hence, if this gain G is made to be large compared with unity, the common mode output component (V1+V2)/2 will reduced by a factor that is large compared with unity and will almost completely be suppressed. More specifically, this open loop gain G is proportional to AgL, where A is the amplifier common-mode amplification factor of the amplifier stage A, g is the transconductance of either of the matched current steering devices CS1 and CS2, and L is the resistance of either of the matched loads L1 and L2. Thus the open loop common-mode gain G can readily be made to be large compared with unity, typically as much as about 500 to 1,000 or more.

Note that in case both input transistors M1 and M2 are turned off by the input signals v1 and v2, respectively, then the currents (I1−i) and (I2−i), respectively, flowing through these transistors M1 and M2 will be zero, since the current source 30 cannot have infinite impedance and hence will cease delivering the current I. Thus, I1=I2=i for this case. In such as case, owing to the continued presence of the negative feedback f, the voltages V1 and V2 at terminals 101 and 102, respectively, will be substantially zero, so that (V1+V2)/2 will be substantially zero; i.e., there will be substantially no common mode output component, as is the desired result. This result is achieved because the current (I−i), and hence the current i, will continue to be adjusted by the negative feedback to reduce the common mode output component even though the input transistors M1 and M2 are both off, since the current steering of CS1 and CS2 even in this case remains operative.

Although the invention has been described in detail with reference to a specific embodiment, various modifications can be made without departing from the scope of the invention. For example, instead of n-channel transistors, p-channel transistors can be used, with appropriate changes in voltage biasing as known in the art. Moreover, instead of having but one stage per section, either the input section or the output section, or both, can have more than one stage.

What is claimed is:

1. An integrated circuit comprising:
   (a) an input difference amplifier section having first and second output nodes;
   (b) an output amplifier section having first and second input nodes respectively connected to the first and second output nodes of the input section, and having first and second output terminals;
   (c) a common mode signal detector, responsive to the voltages developed at the first and second output terminals of the output section, for generating a feedback control signal which is representative of the common mode component of these voltages; and
   (d) first and second matched current steering devices, each having a separate control terminal connected to receive the feedback control signal, connected to the first and second output nodes of the input difference amplifier section whereby the first and second current steering devices draw equal first and second currents, respectively, from the first and second output nodes, respectively, in accordance with the feedback control signal.

2. An integrated circuit according to claim 1 further comprising a utilization means connected to the output terminals of the output difference amplifier section.

3. An integrated circuit including a balanced output differential amplifier circuit arrangement comprising:
   (a) a difference amplifier input section having first and second input terminals and having first and second output nodes;
   (b) an output double-input double-output amplifier section, having first and second input nodes respectively separately connected to the first and second output nodes of the input difference amplifier section, and having first and second output terminals;
   (c) a common mode signal detection means, having a pair of input terminals connected to the first and second output terminals of the output double-ended amplifier section, and having an output terminal for developing a feedback control signal;
   (d) first and second current steering devices, each having a separate control terminal connected to the output terminal of the common mode signal detection means and each having a separate current-carrying terminal separately connected to the first and second output nodes of the input difference amplifier section, whereby the first and second steering devices draw equal currents from the first and second output nodes, respectively, of the input section in response to the feedback control signal.

4. The integrated circuit of claim 3 further comprising a utilization means having first and second input terminals connected to the first and second output terminals of the output double-input double-output amplifier section.

5. The circuit of claim 3 in which amplifier arrangement has an open-loop common-mode gain of at least about 500, whereby the common mode component of the voltages at the first and second output terminals of the output stage is substantially suppressed.

6. The integrated circuit of claim 3 in which the output double-input double-output amplifier section has a pair of matched signal paths from the first and second input nodes to the first and second output terminals, respectively, thereof.

7. The integrated circuit of claim 3 further comprising utilization means connected to the output terminals of the output double-input double-output amplifier section.

* * * * *